United States Patent [19]

Schumacher, III et al.

[11] Patent Number: 4,651,417
[45] Date of Patent: Mar. 24, 1987

[54] METHOD FOR FORMING PRINTED CIRCUIT BOARD

[75] Inventors: John E. Schumacher, III, Boulder; Gene A. Fisher, Lafayette, both of Colo.

[73] Assignee: New West Technology Corporation, Boulder, Colo.

[21] Appl. No.: 664,364

[22] Filed: Oct. 23, 1984

[51] Int. Cl.$^4$ ............................................. H01K 3/22
[52] U.S. Cl. ...................................... 29/848; 29/847; 174/68.5; 427/97
[58] Field of Search ................ 29/846, 847, 848, 849, 29/830; 427/97, 98; 156/233; 174/68.5

[56] References Cited

U.S. PATENT DOCUMENTS

| | | | |
|---|---|---|---|
| 2,772,501 | 12/1956 | Malcolm | 29/849 X |
| 2,958,120 | 11/1960 | Taylor | 29/848 |
| 3,042,591 | 7/1962 | Cado | 174/68.5 X |
| 3,077,511 | 2/1963 | Bohrer et al. | 174/68.5 |
| 3,501,832 | 3/1970 | Iwata et al. | 228/180.1 X |
| 3,606,677 | 9/1971 | Ryan | 29/830 |
| 4,075,757 | 2/1978 | Malm et al. | 29/847 X |
| 4,402,998 | 9/1983 | Kumagai et al. | 427/97 |
| 4,517,739 | 5/1985 | Lenaerts et al. | 29/846 |
| 4,528,064 | 7/1985 | Ohsawa et al. | 427/97 X |
| 4,532,152 | 7/1985 | Elarde . | |

FOREIGN PATENT DOCUMENTS

| | | | |
|---|---|---|---|
| 664915 | 6/1963 | Canada | 29/849 |
| 745773 | 2/1956 | United Kingdom | 29/846 |

Primary Examiner—Howard N. Goldberg
Assistant Examiner—Carl J. Arbes
Attorney, Agent, or Firm—Robert E. Harris

[57] ABSTRACT

An improved method is disclosed for forming a printed circuit board. The desired printed circuit is established on the surface of a plastic core sheet by placing recesses therein conforming to the desired circuit, and a conductive coating is then applied so that the coating is retained at the recesses. Circuit patterns are preferably pressed into one or both sides of the plastic core sheet, and holes can be placed through the sheet to allow circuit connections between the patterns on the opposite sides of the sheet and to receive electrical leads of circuit components. A thin conductive coating is applied by vacuum deposition, and can be thickness enhanced by electroplating. In addition, multilayered printed circuit boards of more than two layers can be formed by applying one or more laminate sheets of plastic to the surfaces of a core sheet having printed circuits formed thereon, and then pressing circuit patterns into the exposed side of the laminate sheets to form recesses therein, which surfaces then have conductive material applied thereto so that the conductive material is retained at the recesses therein to thus form additional printed circuit board layers.

10 Claims, No Drawings

METHOD FOR FORMING PRINTED CIRCUIT BOARD

FIELD OF THE INVENTION

This invention relates to electronic circuits and, more particularly, relates to an improved method for forming printed circuit boards.

BACKGROUND OF THE INVENTION

Electrical connection between electronic components is normally achieved by establishing electrically conductive pathways therebetween. Commonly, this has been done by electrically connecting the components through metallic wires extending therebetween.

More recently, however, such connections have often been established through the use of printed circuits formed on the surfaces of printed circuit boards, which boards included, essentially, a central core of non-conductive material, such as plastic, having circuit patterns of conductive material, normally copper, at one or both sides thereof. It has also been common to drill or punch holes through the sheet to allow connection with leads of other components of the circuit and to allow connections between circuits at opposite sides of the board.

Heretofore, it has been common in forming a printed circuit board to start with a single or double-clad board, i.e., a sheet of plastic material having a sheet of electrically conductive material at one or both sides of the plastic sheet, and then, by chemical processing, removing that portion of the conductive sheet or sheets not needed or wanted, with connections through the holes being commonly established by depositing conductive material on the walls forming the holes.

While such methods for forming printed circuit boards have been found to be effective, at least for preparation of some boards, these methods have not been found to be fully satisfactory in at least some respects, including, for example, relatively high tooling and/or production costs, relatively low quality product and/or production rates, the necessity for disposition of used materials when chemical processing is involved, the loss of excessive amounts of metal that must be removed to form the desired circuit patterns.

SUMMARY OF THE INVENTION

This invention provides a method for forming printed circuit boards that utilizes formation of recesses indicative of and conforming to the desired printed circuit in the surface of the plastic sheet, and thereafter placing and retaining conductive material in the recesses. This enables realization of low tooling and production costs, higher quality products, and higher production rates. In addition, the method of this invention requires no chemical processing, and does not require the use of preformed single or double-clad core sheets. In addition, by adding printed circuit layers through the use of laminate sheets over formed printed circuits on the surfaces of the core sheet, additional surfaces are realized upon which circuit patterns can be formed.

It is therefore an object of this invention to provide an improved method for forming a printed circuit board.

It is still another object of this invention to provide an improved method for forming a printed circuit board wherein the desired circuit pattern is provided with recesses, which recesses have conductive material applied thereto and retained thereat.

It is still another object of this invention to provide an improved printed circuit board that enables low tooling and production costs, higher quality product, and higher production rates.

It is still another object of this invention to provide an improved method for forming a printed circuit board that requires no chemical processing.

It is yet another object of this invention to provide an improved printed circuit board which does not require preformed single or double clad core boards to form the pattern.

It is still another object of this invention to provide an improved method for forming a multilayered printed circuit board which is capable of providing more than two spaced surfaces upon which circuit patterns can be formed.

With these and other objects in view, which will become apparent to one skilled in the art as the description proceeds, this invention resides in the improved method substantially as hereinafter described and more particularly defined by the appended claims, it being understood that changes in the precise embodiment of the herein disclosed invention are meant to be included as come within the scope of the claims.

DESCRIPTION OF THE INVENTION

A sheet of plastic material (or other electrically non-conductive material) is utilized as the base, or core, material upon which the printed circuit patterns are established on one, or as is now often more common, on both of the opposite sides, or surfaces, of the plastic sheet. The sheet of plastic material is preferably a thin sheet (for example, having a thickness of about 0.062 inches) formed from reinforced plastic sheet stock with suitable electrical and thermal characteristics. It has been found, for example, that a polysulfone or polyetherimide sheet reinforced by twenty percent to thirty percent glass fiber content can be effectively utilized as the base, or core, material.

Holes are placed through the sheet with the walls forming the holes extending to the opposite sides of the sheet at the points necessary for connection to printed circuitry at the opposite sides and/or to receive leads from components to be electrically connected into the electronic circuitry to be formed when the board is completed. The holes may be conventionally formed, as by being drilled or punched, for example. It has been found that the depth of the holes can be up to about three times the diameter of the holes and still allow the walls forming the holes to be coated with conductive material.

After the holes have been drilled, the desired pattern for the printed circuit is then pressed into the surface or surfaces of the board to form recesses therein conforming to the printed circuit configuration desired. The thus formed recesses need only be a few thousandths of an inch deep (and may be, for example, about 0.002 inches in depth), and the texture of the pressed plate face is preferably such that the surfaces of the recesses promote adhesion of conductive material added in forming the printed circuit.

For use with this invention, the surface of a rigid plate is coated with a photosensitive resist layer and exposed, and the image is then etched on the plate by suitable chemical process in the same manner and in about the same amount of time as now required to image a single circuit board by known methods. The rigid plate (preferably aluminum or steel) is then used in a press to imprint the pattern on each core to be formed into a printed circuit board as taught by the method of this invention. Thus, instead of having to coat, expose, and then image each plastic sheet, this needs to be done only once on a rigid plate to thus repeatedly imprint the pattern on each of the thermoplastic circuit substrates.

Image processing by imprinting sheets of thermoplastic can be done by automated pressing and handling machinery with cycle times measured in fractions of seconds. Since conventional photosensitive image processes involve surface preparation, photo resist coating or lamination, image exposure, image development, inspection and touch up, and cleaning of photo resist residues before using, image processing by imprinting according to the invention yields a higher quality product. The metal impression plate is inspected very carefully for defects before it is used. Small dust particles which cause defects in individual boards by blocking light during photo imaging do not affect the quality of an imprinted board. If the imprinted plate should be damaged and the defect not quickly corrected, the loss is still insignificant since the thermoplastic material used as the core material can be ground up and remolded or extruded. Although the thermoplastic material constitutes an important part of product costs, the imaging and imprinting costs are insignificant in comparison with the value of the end product.

The temperature of the thermoplastic sheet and press dies may be controlled as needed for effecting adequate recess quality in the sheet surface, with press speed and applied pressures being also controlled as needed for the particular type of plastic sheet utilized. When the holes are drilled before the pattern is pressed into the sheet, studs may also be utilized in the press plate to maintain hole quality and control finished thickness of the plastic sheet.

It is also possible to press the pattern into the sheets before the holes are drilled. In addition, it is possible to combine formation of the holes in the board with pressing of the plate into the surface of the board, such as, for example, by providing the holes in the board while the pattern dies are exerting pressure on the sheet to form the recesses therein, and this can enhance both quality and production rates.

The recesses conforming to the circuit patterns could be injection molded, including formation of holes, into the surface of the sheet, rather than being formed by pressing the pattern into the formed sheet. Such a process has, however, been found to be quite expensive relative to imprinting as described herein.

After formation of the recesses in the surfaces of the board (and after the holes, if any, have been formed therein), the board is then coated with a conductive metal film (such as, for example, copper) by a vacuum deposition process (known as "magnetically enhanced sputtering"). The thus formed film must be thick enough to form a non-porous coating. It has been found that a thickness of about 2 microns is generally sufficient to cover the surface features and to coat the interior of the through holes (which may be up to about three times deeper than is the diameter of the holes).

When the conductive coating is sputtered to a thickness adequate for the intended type of printed circuit board, the surface of the board is then scraped or sanded to remove the conductive coating between the circuitry (i.e., in those areas other than where the recesses are located). After treatment to prevent oxidation and to maintain solderability, the circuit board is ready for use. Solderability of the circuit board can be preserved by utilization of a conventional solder dip or by use of an organic oxide prevention/flux coating.

As can be appreciated from the foregoing, no chemical processing is required or utilized (except for forming the metal imprinting plate). In addition, the only waste water treatment involves filtering of copper particles where wet scrubbing or sanding has been utilized.

When the conductive coating achieved by sputtering is not sufficient, as might be the case, for example, for a contemplated type of board that requires that the conductive coating be several thousandths of an inch thick, the desired enhanced thickness can be achieved by electroplating. To achieve this, the board covered with sputtered copper should be transferred directly from the sputtering system to the copper electroplating system so that cleaning and oxide removal are not needed. Electroplating onto the sputtered copper is then carried out until the desired thickness of metal is reached. The electroplated copper must, however, be substantially stress free in order to avoid pulling the sputtered film from the surface of the board.

In carrying out the electroplating process, a liquid resin, or ink, is applied to the raised surface area with a roller or a similar technique. After curing the resist, the copper left exposed in the recessed circuit pattern and through the holes is electroplated to a thickness of ten or twenty times that of the initial layer. After electroplating is completed, the resist is stripped away by known abrasive or chemical techniques and the metal on the surface can be removed by chemical etching or abrasive scrubbing.

The conductive material film could also be applied by a conventional chemical technique generally described as "electroless deposition". The low cost of required equipment, however, is offset by the high cost of consumable materials and undesirable waste products generated.

The finishing operations can include many variations and can include a wide variety of conventional procedures, including, for example, soldermask coating, legend ink printing, and precious metal plating of contact areas.

This invention may also be utilized to form multi-layered printed circuit boards having more than two spaced surfaces upon which printed circuits can be formed. To accomplish this, additional layers of conductive circuits are established in spaced planes.

While any number of layers can be realized, a four layer printed circuit board is realized, for example, by first processing a sheet to form a printed circuit of conductive material on both sides (one side could be utilized, if desired) in the same manner as set forth hereinabove (i.e., and by way of example, by pressing a desired circuit pattern on both sides of a plastic sheet, and placing holes therein (buried vias) if needed, sputtering copper thereon). The surface of the thus processed sheet is then roll coated with a resin or ink plating resist and the resist cured. The core sheet is then electroplated with copper to completely fill the circuit pattern (excessive thickness in some areas in unimportant). Both surfaces are then abrasively leveled so that material remains only in the circuit traces at the recesses. The surface copper is then prepared for adhesion to thermoplastic material, after which the interior sides of thin laminate sheets of thermoplastic (having holes therein to form blind vias, if needed) are laminated to the opposite sides of the core sheet over the formed circuits thereon. Circuit patterns are then pressed into the exposed, or exterior, sides of the laminated sheets (which can be done as the sheets are laminated to the core sheet) to form recesses therein in the same manner as described hereinabove with respect to the core sheet, with through via holes being formed through the core sheet and laminate sheets as needed (as by drilling or punching). After surface and hole preparation in the same manner as brought out hereinabove, copper is sputtered into the recesses and holes in the laminate sheets in the same manner as described hereinabove, and the board thereafter finished as above described.

Through utilization of this invention, an important benefit is realized by eliminating hazardous waste materials at the site where the circuit boards are manufactured. Instead, the plastic sheet material can be remotely manufactured in large quantities where environmental controls are easily monitored, as opposed to the requirement for monitoring of air pollution, water pollution, and waste disposal at each printed circuit manufacturing facility.

In addition, since no imaging process is needed to form each printed circuit board, there is no need for extensive use of organic photoresist materials, and this eliminates at least some potential problems that might be encountered where such materials must be extensively utilized. The only use of photoresist materials is in connection with forming the desired pattern in the process dies, and needs to be done only once with the resulting pattern dies being thereafter usuable to impress thousands of circuit boards.

Vacuum deposition of copper or similar materials by high rate sputtering generates little waste except for a minute amount of vacuum pump oil which can be easily filtered. In addition, if copper electroplating is used to build or thicken conductive coating materials and through hole walls, simple treatment of the rinse dragout may be employed. Also, abrasive removal of copper between circuit traces generate solid particles which can be removed from air or water by simple filtering.

As can be appreciated from the foregoing, this invention provides an improved method for forming a printed circuit board, including forming a multilayered printed circuit board, and complete embodiments of the invention according to the best mode so far devised for the practical application of the principles thereof have been set forth herein.

What is claimed is:

1. A method for forming a printed circuit board, said method comprising:
    providing a thin sheet of plastic material having substantially flat external surfaces at each side thereof;
    placing holes through said plastic sheet with the walls forming said holes extending between said external surfaces of said plastic sheet;
    pressing a printed circuit configuration onto at least one of said external surfaces so that recesses conforming to said configuration are formed in said surface;
    providing studs receivable in at least a portion of said holes during pressing of said printed circuit configuration into said external surface whereby alignment and maximum thickness of said plastic sheet are assured;
    deposited by vacuum deposition a thin coating of conductive material onto said surface having said recesses pressed therein and onto said walls forming said holes;
    electroplating additional conductive material onto said conductive material deposited by vacuum deposition; and
    partially removing said coating of conductive material deposited by vacuum deposition and said coating electroplated thereon from said surface having said recesses pressed therein by one of scrapping and sanding so that said coatings are retained at said recesses and on said walls forming said holes.

2. The method of claim 1 wherein said holes are placed in said sheet by one of drilling and punching.

3. A method for forming a multi-layered printed circuit board, said method comprising:
    providing an electrically non-conductive core material having external surfaces at opposite sides thereof with each of said surfaces having recesses therein conforming to predetermined printed circuit configurations;
    applying electrically conductive material to said surfaces with said material being retained at said recesses in said external surfaces;
    providing electrically non-conductive material sections each of which has an interior side and an exterior side, and placing said interior side of each of said sections into contact with a different one of said external surfaces of said core material having said conductive material thereon;
    pressing printed circuit configurations onto said exterior side of each of said non-conductive material sections so that said exterior sides have recesses therein conforming to predetermined printed circuit configurations; and
    applying electrically conductive material to said exterior sides of said non-conductive material sections so that said conductive material is retained at said recesses to thereby form a plurality of layers of printed circuits on said board.

4. The method of claim 3 wherein said electrically non-conductive core material and said electrically non-conductive material sections are plastic sheets.

5. The method of claim 3 wherein said electrically conductive material is applied to said external surfaces and said exterior sides by magnetically enhanced sputtering said conductive material onto said surfaces and sides.

6. The method of claim 3 wherein said method includes electroplating conductive material onto said electrically conductive material applied at said external surfaces to enhance the thickness thereof.

7. The method of claim 3 wherein said electrically conductive material applied to said external surfaces and exterior sides is removed from the areas of said surfaces and sides other than at said recesses.

8. The method of claim 3 wherein said method includes placing holes through said core material and through said non-conductive material sections with the walls forming said holes being coated with conductive material when said electrically conductive material is applied to said external surfaces and exterior sides.

9. A method for forming a multi-layered printed circuit board, said method comprising:
    providing a thin sheet of plastic material having opposite sides with recesses therein conforming to predetermined printed circuit patterns;

placing holes through said plastic sheet with the walls forming said holes extending to each of said opposite sides;

depositing a thin coating of electrically conductive material onto each of said opposite sides with said conductive material also coating the walls forming said holes;

depositing additional electrically conductive material onto said conductive material at said recesses and at said walls forming said holes;

removing the thin coating of electrically conductive material from areas on said opposite sides other than at said recesses and said walls forming said holes;

placing holes in first and second laminate sheets of non-conductive material with the walls forming said holes extending to the interior and exterior sides of said laminate sheets;

applying said first and second laminate sheets to opposite sides of said plastic sheet with the interior side of each of said laminate sheets being in contact with said opposite sides of different ones of each of said plastic sheets having said printed circuits of conductive material thereon so that the exterior sides of each of said laminate sheets being spaced from said plastic sheet;

pressing predetermined printed circuit configurations into the exterior sides of said first and second laminate sheets so that said exterior sides have recesses therein conforming to said printed circuit configurations pressed therein;

placing holes through said plastic sheet and said laminate sheets;

depositing conductive material on said exterior sides of said first and second laminate sheets with said conductive material also being applied to the walls forming said holes therein; and removing said conductive material from the areas of said exterior surface of said first and second laminate sheets other than at said recesses and walls forming said holes.

10. The method of claim 9 wherein said holes are formed in said plastic sheets and laminate sheets by use of one of drilling and punching, wherein said conductive material is deposited on said opposite sides and exterior sides by vacuum deposition, and wherein said conductive material is removed from said opposite sides and exterior sides by means of one of sanding and scraping.

* * * * *